United States Patent
Incarbone et al.

(10) Patent No.: US 9,417,279 B2
(45) Date of Patent: Aug. 16, 2016

(54) METHOD AND SYSTEM FOR DIAGNOSING A CABLE BY DISTRIBUTED REFLECTOMETRY WITH SELF-SELECTIVE AVERAGE

(71) Applicant: COMMISSARIAT A L'ENERGIE ATOMIQUE ET AUX ENERGIES ALTERNATIVES, Paris (FR)

(72) Inventors: Luca Incarbone, Antony (FR); Laurent Sommervogel, Jouy-en-Josas (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 76 days.

(21) Appl. No.: 14/390,020

(22) PCT Filed: Mar. 21, 2013

(86) PCT No.: PCT/EP2013/055884
§ 371 (c)(1),
(2) Date: Oct. 1, 2014

(87) PCT Pub. No.: WO2013/149839
PCT Pub. Date: Oct. 10, 2013

(65) Prior Publication Data
US 2015/0077131 A1    Mar. 19, 2015

(30) Foreign Application Priority Data
Apr. 3, 2012   (FR) ................................... 12 53054

(51) Int. Cl.
*G01R 31/11* (2006.01)
*G01R 31/02* (2006.01)
*G01R 31/08* (2006.01)

(52) U.S. Cl.
CPC .............. *G01R 31/11* (2013.01); *G01R 31/021* (2013.01); *G01R 31/083* (2013.01)

(58) Field of Classification Search
CPC ........ G01R 31/11; G01R 31/08; G01R 31/21; G01R 31/085; G01R 31/083; G01R 31/088; G01R 31/3016; G01R 31/31937; G01R 31/31725; G01R 27/28; H04L 12/2697; H04L 43/50; H04B 3/462; H04B 3/46
USPC ..................... 324/532–535, 543, 644, 84, 508
See application file for complete search history.

(56) References Cited

U.S. PATENT DOCUMENTS 7,005,861 B1 * 2/2006 Lo ........................ G01R 31/021
                                                       324/533
7,295,018 B2 * 11/2007 Oakley ................... G01R 31/11
                                                       324/533

(Continued)

FOREIGN PATENT DOCUMENTS

| | | |
|---|---|---|
| FR | 2907910 A1 | 5/2008 |
| FR | 2937146 A1 | 4/2010 |
| WO | 2010043602 A1 | 4/2010 |

OTHER PUBLICATIONS

Adrien Lelong, "Methodes de diagnostic filaire embarque pour des reseaux complexes", URL:http://www.theses.fr/2010LIL10121, Dec. 9, 2010, pp. 1-167, XP055047458.

*Primary Examiner* — Tung X Nguyen
*Assistant Examiner* — Thang Le
(74) *Attorney, Agent, or Firm* — Baker & Hostetler LLP (57) ABSTRACT

A method of testing a cable by distributed reflectometry, comprises: injecting into the cable a first periodic signal and a second periodic signal having the same number N of periods and the same number M of samples per period as the first signal; acquiring a measurement of the reflection, from impedance discontinuities of the cable, of each of said first and second signals; taking the average of said measurements of the reflection of at least one of said first or second signals over all of its periods to produce at least one reflectogram; determining the positions of faults in the cable on the basis of at least the reflectogram; the method being wherein each period of the second signal is injected into the cable with a delay or an advance which has an increasing predetermined absolute value for each successively injected period.

9 Claims, 5 Drawing Sheets

(56) References Cited

U.S. PATENT DOCUMENTS

| | | | | |
|---|---|---|---|---|
| 7,679,371 B1* | 3/2010 | Lo | G01R 31/11 324/528 |
| 8,620,605 B2* | 12/2013 | Guilhemsang | G01R 31/11 324/527 |
| 8,988,099 B2* | 3/2015 | Hall | G01R 31/11 324/76.11 |
| 9,019,855 B2* | 4/2015 | Nielsen | H04B 3/50 370/252 |
| 9,313,112 B2* | 4/2016 | Fertner | H04B 3/493 |
| 2003/0222654 A1* | 12/2003 | Furse | G01F 23/0069 324/543 |
| 2004/0251912 A1* | 12/2004 | Pharn | G01R 31/11 324/534 |
| 2005/0247924 A1* | 11/2005 | Atwater | B82Y 20/00 257/13 |
| 2010/0141264 A1* | 6/2010 | Ravot | G01R 31/11 324/533 |
| 2010/0211338 A1 | 8/2010 | Ravot et al. | |
| 2011/0307197 A1 | 12/2011 | Lelong | |

\* cited by examiner

METHOD AND SYSTEM FOR DIAGNOSING A CABLE BY DISTRIBUTED REFLECTOMETRY WITH SELF-SELECTIVE AVERAGE

CROSS-REFERENCE TO RELATED APPLICATIONS

This application is a National Stage of International patent application PCT/EP2013/055884, filed on Mar. 21, 2013, which claims priority to foreign French patent application No. FR 1253054, filed on Apr. 3, 2012, the disclosures of which are incorporated by reference in their entirety.

FIELD OF THE INVENTION

The present invention proposes a method and a system for diagnosing a cable or a cable network by distributed reflectometry.

The invention relates to the field of reflectometry for fault location in electrical cables.

Reflectometry consists in sending a signal along a cable or a cable network and then measuring the returned echoes created by reflections of the injected signal from singularities or impedance discontinuities in the cable. The delay and amplitude of these echoes can be used to obtain information on the structure of this network or the electrical faults present in it. More generally, each echo corresponds to a singularity. Thus a failure can be located, characterized and, if appropriate, predicted. The well-known conventional methods of reflectometry are time domain reflectometry (TDR) and frequency domain reflectometry (FDR).

The invention relates more specifically to distributed reflectometry, which can be used to make simultaneous diagnostic measurements at a number of points in the cable to be tested, using a number of reflectometry devices injecting a test signal into the cable at the same time.

Distributed reflectometry is particularly suitable for locating faults or failures affecting very long cables, such as signal cables on a rail network. If two dead faults occur, this method can also be used to locate the position of both faults and to determine the distance between them. This type of problem may arise if the cable is, for example, cut at two separate points with the aim of removing a whole segment of cable. With a single reflectometer, it is possible to detect a point fault, and to find the distance between this fault and the signal injection point, but the position of a second fault cannot be determined, and therefore the length of a removed segment of cable cannot be determined. Distributed reflectometry can be used, notably, to obtain this type of information. In the example mentioned above, a second reflectometer is positioned at a second point of the cable, for example at an end opposite the first injection point. If a portion of the cable is cut and removed, the information produced by the two reflectometry devices can be used to deduce the position of the two faults, as well as the length of the removed portion of cable.

Furthermore, distributed reflectometry can be used to acquire measurements over longer distances. This is because, if each reflectometer can monitor a certain length of cable, two reflectometers positioned at two distant points can monitor twice that length.

BACKGROUND

The problem with distributed reflectometry methods is that the measurement made by a reflectometer is affected by parasitic test signals from the other reflectometer or reflectometers. This interference becomes more limiting if the various reflectometers making up the distributed system are not temporally synchronized with one another.

The received signal must therefore be subjected to special processing in order to eliminate this interference; if this is not done, the measurement cannot be used. This processing consists in discriminating the signals originating from different reflectometers in order to retain only the signal emitted by the reference reflectometer.

A first known method of distributed reflectometry is described in French patent application FR2907910, filed by the present applicant. This method consists in using pseudo-random sequences of the M-sequence type as a test signal. The aim of the method is to minimize cross correlation, that is to say the statistical resemblance of signals, between the sequences generated by the different reflectometers. The post-processing performed on the measurements of the reflected signals consists in applying appropriate filtering, as is done in the known method of reflectometry called sequence time domain reflectometry (STDR). A drawback of this method is that it requires post-processing to discriminate the measurements corresponding to the signals injected by the different reflectometers. Furthermore, the profile of the test signal concerned is not particularly suitable for diagnosing long cables (several kilometers in length), since the attenuation of the injected signal affects the performance of the discrimination algorithm.

A second method of distributed reflectometry forms the subject of international patent application WO2010/043602, filed by the present applicant. This method uses a set of weighting coefficients for modulating the test signal and a weighted average of the measurements of the reflected signal. The weighting coefficients are chosen so as to be orthogonal to one another, so that only the signal originating from the desired sources is retrieved, the interference noise from the other sources being canceled by the calculation of the average.

However, this method is valid only if the injected test signal has a zero average, which cannot be the case, for example, with a temporal pulse.

This is because, if a full scale pulse is injected into a very long line, that is to say if the whole dynamic range of the converters is used, including the range on the negative voltage side, then a disturbing transition is observed at the changeover point of the weighting coefficient, due to the effects of capacitive discharge. This transition interferes with the average that is calculated subsequently, and therefore with the final measurement of the reflectometer.

SUMMARY OF THE INVENTION

The invention enables the limitations of the aforesaid prior art methods of distributed reflectometry to be overcome by introducing a controlled delay between the signals injected by the different reflectometers of the distributed system.

The invention has the advantage of requiring no discrimination post-processing of the measurements of the reflected signals. Moreover, the invention is compatible with any type of test signal, including zero-average signals. The test signal can use the whole dynamic range of the converters. This characteristic is particularly useful for the diagnosis of very long cables or for the monitoring of long distances of several kilometers or thereabouts. This is because, for these applications, the injected test signal must have maximum energy at injection to limit the effect of attenuation of the signal during its propagation along the cable.

The invention is applicable to the diagnosis of all types of electrical power or communications cable, and more particularly to the detection of electrical faults or cuts in the signal cables of a rail network.

The invention therefore proposes a method of testing a cable by distributed reflectometry comprising the following steps:

injecting into the cable, at a first injection point, a first periodic signal, and, at a second injection point, a second periodic signal having the same number N of periods and the same number M of samples per period as the first signal, acquiring, at one or more cable observation points, a measurement of the reflection, from impedance discontinuities of the cable, of each of said first and second signals, said acquisition being synchronized with the injection of a signal from among said first and second signals, taking the average of said measurements of the reflection of at least one of said first or second signals over all of its periods to produce at least one reflectogram, determining the positions of faults in the cable on the basis of at least said reflectogram, said method being characterized in that each period of said second signal is injected into the cable with a delay or an advance having a constant predetermined absolute value.

In a variant embodiment, the method according to the invention further comprises the following steps:

injecting into the cable, at a third injection point, a third periodic signal having the same number N of periods and the same number M of samples per period as said first signal, if the periods of the second signal are injected into the cable with a delay, injecting each period of said third signal with an advance, if the periods of the second signal are injected into the cable with a delay, injecting each period of said third signal with an advance, the absolute value of the advance or delay at the injection of a period of the third signal being set equal to the absolute value of the delay or the advance at the injection of a period of the second signal.

According to a particular aspect of the invention, the absolute value of the delay or the advance is zero for the first period and is equal to a time difference equivalent to a number K of signal samples for each successive period.

According to another particular aspect of the invention, each period is increased or decreased by a number K of samples in order to obtain the delay or advance.

According to another particular aspect of the invention, the number of samples M of a period is equal to K times the number N of periods over which the average is taken.

In a variant embodiment of the invention, said periodic signals are selected from among the following signals: a temporal pulse, a time slot, a triangular signal, and a zero-average signal.

The invention also proposes a distributed reflectometry system comprising at least a first and a second reflectometry test device positioned at two or more separate points of the same cable to be tested, characterized in that each device comprises means adapted for executing the test method according to the invention.

BRIEF DESCRIPTION OF THE DRAWINGS

Other characteristics and advantages of the present invention will become more apparent in the light of the following description, relating to the attached drawings, which show:

in FIG. 1, a diagram of a distributed reflectometry system according to the invention, in FIGS. 2a and 2b, an example of a test signal generated by a reflectometer, in FIG. 3, an illustration, in a number of timing charts, of the problem of loss of synchronization between two reflectometers of a distributed system, in FIG. 4, a representation, in two timing charts, of the test signals injected by two reflectometers of a distributed system according to the invention, in FIG. 5, a representation, in three timing charts, of the test signals injected by three reflectometers of a distributed system according to a variant embodiment of the invention, in FIG. 6, a representation of a triangular test signal for the diagnosis of long cables.

DETAILED DESCRIPTION

Figure 1:
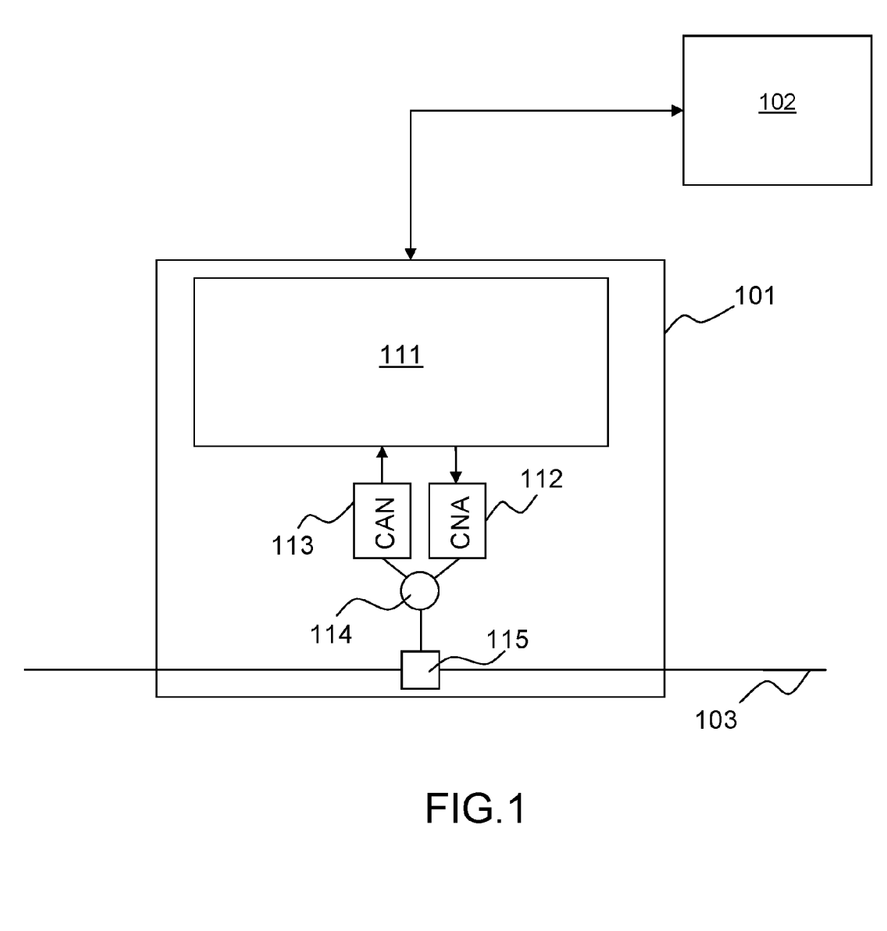

FIG. 1 shows schematically, in a synoptic diagram, a reflectometry device 101 of a distributed reflectometry system including at least two devices of this type.

A reflectometry device 101, or reflectometer, includes at least one electronic component 111 of the integrated circuit type, such as a programmable logic circuit, of the FPGA or microcontroller type for example, a digital-analog converter 112 for injecting a test signal into the cable to be tested 103, an analog-digital converter 113 for receiving the signal reflected from the impedance discontinuities or singularities of the cable, a coupling device 114 between the analog-digital converter 113 and the digital-analog converter 112, and a coupling means 115 between an input/output of the device 101 and the cable to be tested 103. The coupling means is adapted to inject the output signal of the digital-analog converter 112 into the cable 103 and to receive the reflected signal or signals.

The device 101 can be implemented in an electronic circuit board on which the different components 112, 113, 114 of the device are placed. The coupling and injection means 115 is connected to an input/output of the card.

Additionally, a processing unit 102, such as a computer, personal digital assistant or other device, can be used to control the reflectometry device 101 and display the measurement results on a human-machine interface.

The electronic component 111 executes, on the one hand, the processing steps required for the generation of the injection signal, and, on the other hand, an analysis of the reflected signal, in order to deduce from this signal a reflectogram which is transmitted to the processing unit 502.

The coupling and injection means 115 can be implemented by using a capacitive or inductive effect, or with an ohmic connection. They can be implemented by physical connecting means.

A distributed reflectometry system includes at least two reflectometry devices 101 positioned at two separate points of the same cable to be tested 103, or of a cable network. The signals injected by each reflectometry system then mutually disturb the acquisitions of the reflected signals.

Figure 2A:
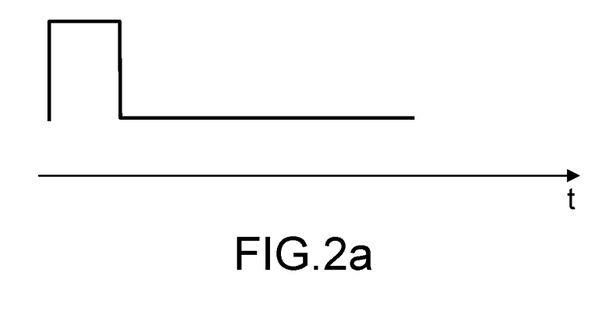

The technical problem which the invention is intended to overcome will now be described with reference to a non-limiting example of a distributed system comprising two reflectometers A and B positioned at two separate points of the same cable. Purely by way of illustration, the signal injected into the cable by one or other of the reflectometers A or B is represented by a vector, each value of which represents the amplitude of the signal at an instant or a sample of this signal. A chosen example is that of a sequence of a pulse signal comprising four samples and represented by the vector (1 0 0 0), a temporal representation of which is given in FIG. 2a. The choice of a number of samples equal to four and a signal amplitude equal to 0 or 1 is made for the sake of simplicity, but the injected signal can have any size or profile, as detailed below.

Figure 2B:
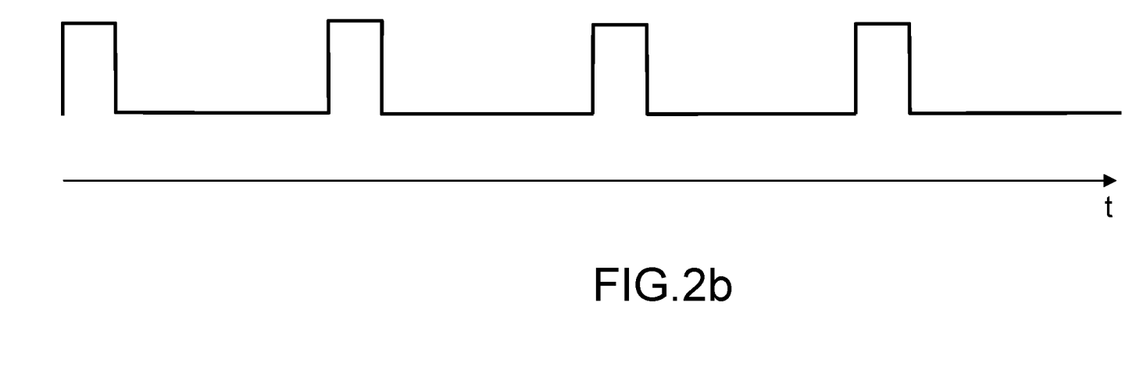

In order to increase the signal to noise ratio and therefore the accuracy of the location of a fault affecting the cable to be tested, the measurements of the reflected signal must be averaged over a plurality of time periods. The signal to be injected must therefore be composed of a plurality of time periods, equal to the sequence of FIG. 2a. FIG. 2b shows the complete signal to be injected, composed of four periods of the sequence of FIG. 2a.

The signal generated in this way can be represented in the following matrix form:

$$\begin{pmatrix} 1 & 0 & 0 & 0 \\ 1 & 0 & 0 & 0 \\ 1 & 0 & 0 & 0 \\ 1 & 0 & 0 & 0 \end{pmatrix}$$

Each row of the matrix represents a period of the test signal. The injection of the test signal and the acquisition of the reflected signal are synchronized, and the result of the average of the acquisitions therefore yields the vector $$\frac{1}{4}(4 \quad 0 \quad 0 \quad 0)$$

or alternatively (1 0 0 0).

The measurement of the averaged signal is therefore identical to the injected signal because of the synchronization of the injection and the acquisition.

We shall now consider a distributed system comprising two reflectometers A and B positioned on the same cable and each injecting the same test signal shown in FIG. 2b.

If the injection of the two devices is not synchronized, each reflectometer will receive the reflections of both signals, which are superimposed and time-shifted.

Figure 3:
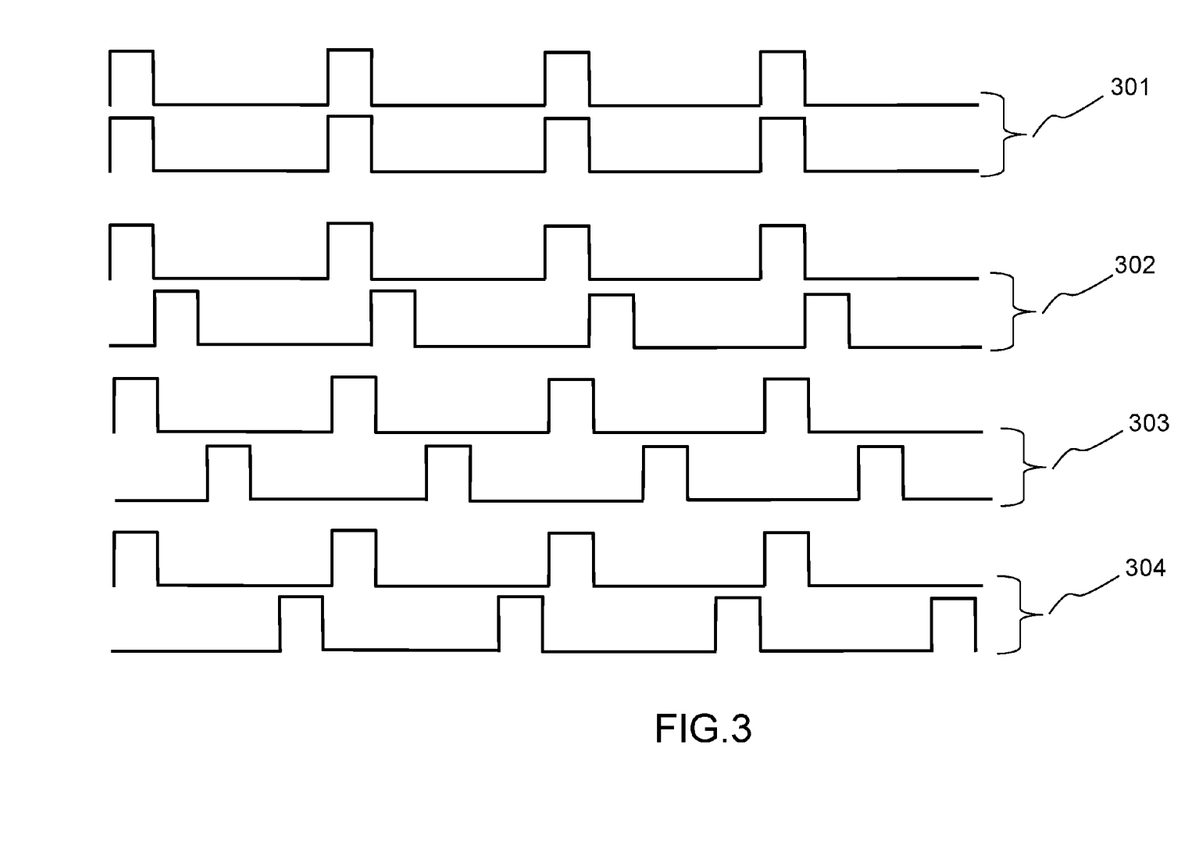

FIG. 3 shows, in four timing charts, the various possible losses of synchronization between the two injected signals, for the example of the signal given in FIG. 2b.

The first set of timing charts 301 shows the two injected signals when they are temporally synchronized. Each reflectometer receives a reflected signal corresponding to the superimposition of these two signals which can be represented by the matrix $$\begin{pmatrix} 1_a + 1_b & 0 & 0 & 0 \\ 1_a + 1_b & 0 & 0 & 0 \\ 1_a + 1_b & 0 & 0 & 0 \\ 1_a + 1_b & 0 & 0 & 0 \end{pmatrix}$$

where $1_a$ denotes the pulse amplitude of the signal injected by the first reflectometer A, and $1_b$ denotes the pulse amplitude of the signal injected by the first reflectometer B.

The second set of timing charts 302 represents the case in which the second signal is injected into the cable with a delay of one sample relative to the first signal. The reflected signal received by each reflectometer is given by the matrix $$\begin{pmatrix} 1_a & 1_b & 0 & 0 \\ 1_a & 1_b & 0 & 0 \\ 1_a & 1_b & 0 & 0 \\ 1_a & 1_b & 0 & 0 \end{pmatrix}$$

The third set of timing charts 303 represents the case in which the second signal is injected into the cable with a delay of two samples relative to the first signal. The reflected signal received by each reflectometer is given by the matrix $$\begin{pmatrix} 1_a & 0 & 1_b & 0 \\ 1_a & 0 & 1_b & 0 \\ 1_a & 0 & 1_b & 0 \\ 1_a & 0 & 1_b & 0 \end{pmatrix}$$

The fourth set of timing charts 304 represents the case in which the second signal is injected into the cable with a delay of three samples relative to the first signal. The reflected signal received by each reflectometer is given by the matrix $$\begin{pmatrix} 1_a & 0 & 0 & 1_b \\ 1_a & 0 & 0 & 1_b \\ 1_a & 0 & 0 & 1_b \\ 1_a & 0 & 0 & 1_b \end{pmatrix}$$

After calculation of the average over the four periods of the injected signal, the following results (2 0 0 0) or (1 1 0 0) or (1 0 1 0) or (1 0 0 1) are obtained, according to circumstances.

Thus it can be seen that the resulting average is disturbed by the injection of a second test signal and the result of the measurement made on the reflected signal depends on the asynchronism between the two reflectometers. In this case, the measurement cannot be used to deduce the location of a fault in the cable.

Furthermore, the clocks of the two reflectometers may be subject to a drift which, even if it is extremely small, may eventually result in an offset between the injections of the two signals, even if the reflectometers are correctly synchronized initially.

In order to eliminate or limit the mutual effects of the two injected test signals on the reflectometry measurements, the invention consists in configuring one of the two signals by adding a controlled delay on each injection of a period of the test signal.

Figure 4:
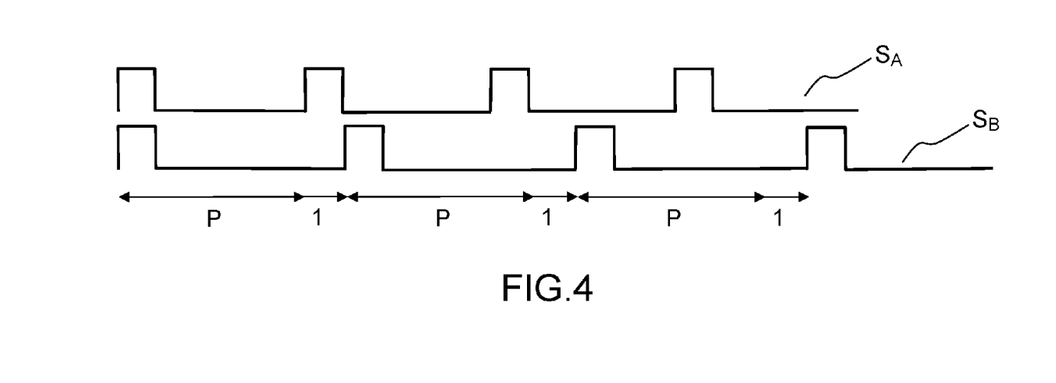

Referring again to the example of a test signal in FIG. 2b, FIG. 4 shows schematically the signal configuration used by the invention. The first signal $S_A$ injected by the first reflectometer is the signal as shown in FIG. 2b. The second signal $S_B$ injected by the second reflectometer is made up of four identical periods P. Each period is delayed by a controlled delay before being injected. The delay is configured in the following manner. The injection delay of the first period P is zero.

A complementary delay of one sample's length is then added to the injection of each successive period, as shown in FIG. 4.

The same result may be obtained by generating the second signal $S_B$ on the basis of four periods of a sequence having five samples, that is to say one sample more than the first signal $S_A$.

When the second signal $S_B$ is configured as described above, the reflectometer A, whose acquisition is synchronized with the injection of the first signal $S_A$, sees a reflected signal which can be represented by the following matrix:

$$\begin{pmatrix} 1_a + 1_b & 0 & 0 & 0 \\ 1_a & 1_b & 0 & 0 \\ 1_a & 0 & 1_b & 0 \\ 1_a & 0 & 0 & 1_b \end{pmatrix}.$$

By taking the average of the four acquisitions, we find the signal represented by the vector $$\frac{1}{4}(5 \quad 1 \quad 1 \quad 1).$$

From the viewpoint of the second reflectometer B, whose acquisition is synchronized with the injection of the second signal $S_B$ and is carried out on four samples of each period (to obtain a measurement that is consistent with that of the reflectometer A), we see a reflected signal represented by the following matrix $$\begin{pmatrix} 1_b + 1_a & 0 & 0 & 0 \\ 1_b & 0 & 0 & 1_a \\ 1_b & 0 & 1_a & 0 \\ 1_b & 1_a & 0 & 0 \end{pmatrix}$$

and after taking the average of the four acquisitions we obtain a signal represented by the vector $$\frac{1}{4}(5 \quad 1 \quad 1 \quad 1),$$

which is therefore identical to that measured by the first reflectometer A. The measurements obtained after averaging by the two reflectometers A and B are similar to one period of the injected test signal represented by the vector (1 0 0 0) in the direction where the signal pulse is detectable and located on the first sample as at the time of injection. The continuous component, equal to ¼ in this case, can be eliminated, and this component tends toward a zero value when the depth of averaging increases.

Briefly, the method according to the invention consists in the execution of the following steps. A first test signal $S_A$ is injected into the cable at a first point by a first reflectometer A. The first signal $S_A$ is composed of a number N of consecutive periods of the same sequence of a signal. In the example of FIG. 2b, this sequence is a pulse comprising a sample with an amplitude of 1 and three samples of zero value. Any other test signal suitable for diagnosing cable faults by reflectometry could be used. The number of signal samples contained in a period is denoted M. A second test signal $S_B$ is injected into the cable at a second point by a second reflectometer B. The second signal $S_B$ is composed of the same number N of consecutive periods of the same sequence of a signal which is identical to or different from the first signal used to form the signal $S_A$. Each period includes the same number of samples M as a period of the first signal $S_A$. Each period of the second signal $S_B$ is injected into the cable with a controlled delay T which is initially zero and then is set at a given number K of samples for each successive period. In the example of FIG. 4, K is set at 1. The duration of a sample is, for example, equal to one clock period of the reflectometer. The delay is reinitialized to a zero value when all the periods of the second signal $S_B$ have been injected into the cable. In other words, in the case of a signal composed of four periods, the first period is injected with a zero delay and the following periods are injected with a temporal delay equivalent to K samples.

In a variant embodiment of the invention, instead of inserting a delay on the injection of each period of the second signal $S_B$, it is also possible to add K signal samples at the end of each period, which is equivalent to the insertion of controlled delays and produces the same desired effect.

In general terms, each period of said second signal $S_B$ is injected into the cable with a delay or an advance having a predetermined absolute value for each successive period.

Advantageously, the number K of added samples, or the temporal delay having a duration equal to the duration of K signal samples, is configured so that the number of samples per period M is equal to the number of periods N multiplied by the number of samples K. Thus it is ensured that each signal $S_A$, $S_B$ injected by one of the reflectometers does not disturb the reflectometry measurement made by another reflectometer, since the offset of each period of this signal causes an attenuation of this signal after calculation of the average. Thus the mutual interference between the two injected signals is canceled, or greatly limited, after the acquisition and averaging of the reflected signals over the N periods.

Each reflectometer acquires the signal reflected in the cable, and then an average of the result over the N periods. For any given reflectometer, the injection is synchronized with the acquisition. Thus, for the second reflectometer B, the acquisition is performed on the initial number M of samples per period, with allowance for the delays introduced into the injected test signal $S_B$. In other words, the acquisitions of the reflected signals must be synchronized with the respective injections.

More generally, the signal pulse shown in FIG. 2b by way of example may be replaced by any signal containing M samples of variable amplitude.

Figure 5:
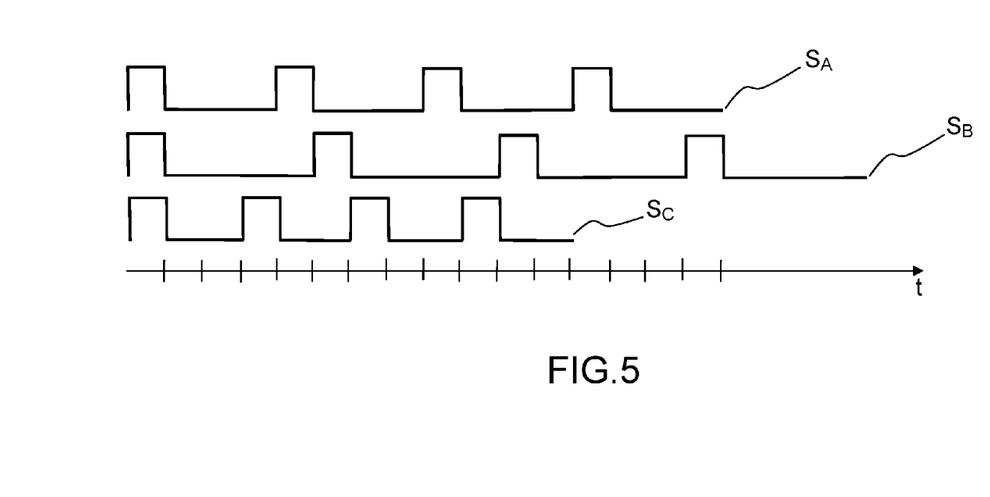

Instead of two reflectometers, a variant embodiment of the invention uses three reflectometers A, B, C, positioned at three separate points $P_A$, $P_B$, $P_C$ on the same cable. The points $P_B$, $P_C$ are positioned on either side of the point $P_A$.

FIG. 5 shows the timing charts of the three test signals injected by the three reflectometers into the cable being tested.

The first reflectometer A injects a first signal, called the reference signal, $S_A$, which is for example the signal of FIG. 2b.

The second reflectometer B injects a second signal $S_B$, obtained as described above by the method according to the invention.

The third reflectometer C injects a third signal $S_C$, which is obtained in a similar manner to the second signal $S_B$, but instead of inserting a controlled delay at the start of each period or adding a predetermined number of samples at the end of each period, the opposite procedure is followed, by advancing each period by the same multiple temporal offset of K samples as the second signal $S_B$, or by eliminating a number K of samples in each period. Thus the mutual effects of the three signals are limited.

Figure 6:
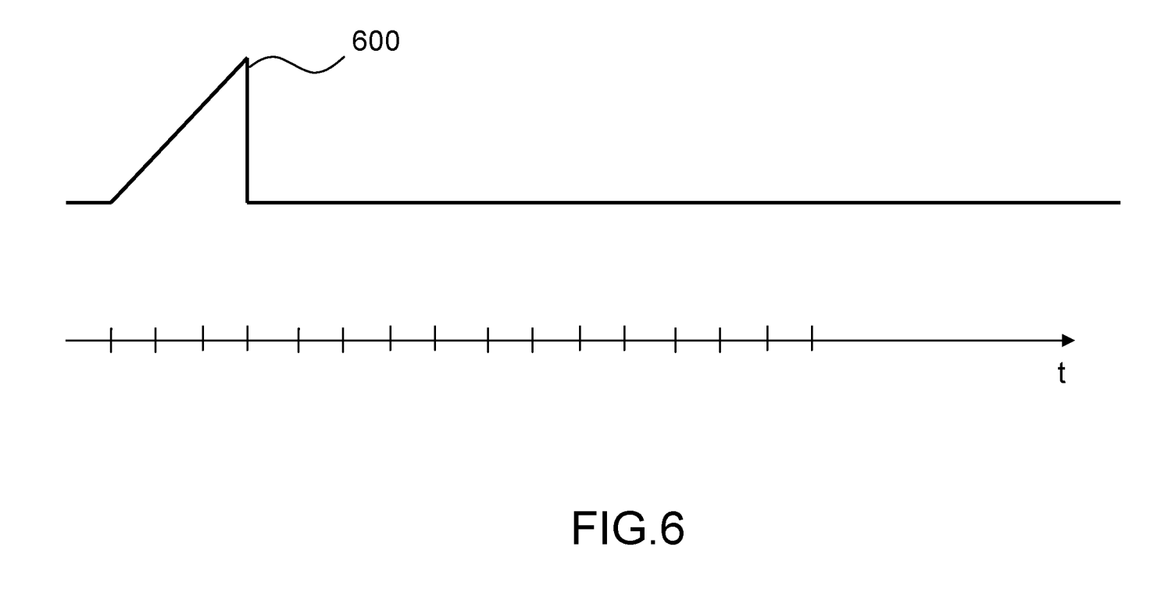

The invention is compatible with any type of test signal, including zero-average signals. One example of a test signal which is advantageously used for the diagnosis of long cables is a triangular signal as shown in FIG. 6. Other test signals, such as a pulse or a time slot, as shown in FIGS. 2 to 5, could also be used.

The invention can be used to provide an accurate reflectometry measurement even when the different devices for injecting signals into the cable to be tested are not temporally synchronized with each other.

The invention claimed is:

1. A method for testing a cable by distributed reflectometry, comprising:
   producing a first periodic signal and a second periodic signal having the same number N of periods and the same number M of samples per period,
   injecting into the cable, at a first injection point, the first periodic signal, and, at a second injection point, the second periodic signal,
   acquiring, at one or more cable observation points, a measurement of the reflection, from impedance discontinuities of the cable, of each of said first and second signals, said acquisition being synchronized with the injection of a signal from among said first and second signals,
   taking the average of said measurements of the reflection of at least one of said first or second signals over all of its periods to produce at least one reflectogram, and
   determining the positions of faults in the cable on the basis of at least said reflectogram, and
   wherein each period of said second signal is injected into the cable with a delay or an advance having a constant predetermined absolute value.

2. The method of claim 1, wherein a period of the first periodic signal is identical to a period of the second periodic signal.

3. The method of claim 1, further comprising:
   injecting into the cable, at a third injection point, a third periodic signal having the same number N of periods and the same number M of samples per period as said first signal,
   if the periods of the second signal are injected into the cable with a delay, injecting each period of said third signal with an advance, and
   if the periods of the second signal are injected into the cable with an advance, injecting each period of said third signal with a delay, and
   the absolute value of the advance or delay at the injection of a period of the third signal being set equal to the absolute value of the delay or the advance at the injection of a period of the second signal.

4. The method of claim 3, wherein a period of the third periodic signal is identical to a period of the first periodic signal or of the second periodic signal.

5. The method of claim 1, wherein the absolute value of the delay or the advance is zero for the first period and is equal to a time difference equivalent to a number K of signal samples for each successive period.

6. The method of claim 1, wherein each period is increased or decreased by a number K of samples in order to obtain the delay or advance.

7. The method of claim 5, wherein the number of samples M of a period is equal to K times the number N of periods over which the average is taken.

8. The method of claim 1, wherein said periodic signals are selected from among the following signals: a temporal pulse, a time slot, a triangular signal, and a zero-average signal.

9. A distributed reflectometry system comprising at least a first and a second reflectometry test device positioned at two or more separate points of the same cable to be tested, wherein each device comprises means, including a processor, configured for:
   producing a first periodic signal and a second periodic signal having the same number N of periods and the same number M of samples per period,
   injecting into the cable, at a first injection point, the first periodic signal, and, at a second injection point, the second periodic signal,
   acquiring, at one or more cable observation points, a measurement of the reflection, from impedance discontinuities of the cable, of each of said first and second signals, said acquisition being synchronized with the injection of a signal from among said first and second signals,
   taking the average of said measurements of the reflection of at least one of said first or second signals over all of its periods to produce at least one reflectogram, and
   determining the positions of faults in the cable on the basis of at least said reflectogram,
   wherein each period of said second signal is injected into the cable with a delay or an advance having a constant predetermined absolute value.

* * * * *